US007821180B2

(12) United States Patent
Kunkel, III

(10) Patent No.: US 7,821,180 B2
(45) Date of Patent: Oct. 26, 2010

(54) CURVED TWO-DIMENSIONAL ARRAY TRANSDUCER

(75) Inventor: Hal Kunkel, III, State College, PA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 205 days.

(21) Appl. No.: 11/996,998

(22) PCT Filed: Jul. 24, 2006

(86) PCT No.: PCT/IB2006/052535

§ 371 (c)(1), (2), (4) Date: Jun. 5, 2008

(87) PCT Pub. No.: WO2007/017780

PCT Pub. Date: Feb. 15, 2007

(65) Prior Publication Data

US 2008/0315724 A1 Dec. 25, 2008

Related U.S. Application Data

(60) Provisional application No. 60/706,190, filed on Aug. 5, 2005.

(51) Int. Cl.
*H01L 41/04* (2006.01)

(52) U.S. Cl. .................................... 310/322; 310/334

(58) Field of Classification Search ................. 310/322, 310/334, 335
See application file for complete search history.

(56) References Cited

U.S. PATENT DOCUMENTS

| | | | | |
|---|---|---|---|---|
| 5,648,942 | A | 7/1997 | Kunkel | |
| 6,263,551 | B1 | 7/2001 | Lorraine | |
| 6,415,485 | B1 * | 7/2002 | Hanafy | 29/25.35 |
| 6,822,376 | B2 * | 11/2004 | Baumgartner | 310/365 |
| 6,894,425 | B1 * | 5/2005 | Solomon et al. | 310/334 |
| 2003/0011285 | A1 * | 1/2003 | Ossmann | 310/334 |
| 2003/0028108 | A1 * | 2/2003 | Miller | 600/437 |
| 2004/0048470 | A1 | 3/2004 | Dinet et al. | |
| 2006/0186765 | A1 * | 8/2006 | Hashimoto | 310/334 |
| 2007/0267945 | A1 * | 11/2007 | Sudol | 310/334 |

FOREIGN PATENT DOCUMENTS

WO 20030000137 A 1/2003

* cited by examiner

*Primary Examiner*—Walter Benson
*Assistant Examiner*—Derek J Rosenau
(74) *Attorney, Agent, or Firm*—W. Brinton Yorks, Jr.

(57) ABSTRACT

A curved two-dimensional array transducer includes a layer of piezoelectric material overlaying a layer of ASICs which is attached to a backing wing. The piezoelectric material is diced in orthogonal azimuth and elevation directions to form a two-dimensional array of transducer elements, with the dicing cuts in the elevation direction extending through the ASIC layer so that the piezoelectric layer and the ASIC layer can be bent in the azimuth direction. The backing wing provides a flexible substrate which can be bent while supporting the ASIC layer and piezoelectric elements. In a second example the piezoelectric layer and ASIC layer are attached to opposite sides of flex circuit which provides the flexible substrate after the piezoelectric layer and ASIC layer are diced.

17 Claims, 11 Drawing Sheets

CURVED TWO-DIMENSIONAL ARRAY TRANSDUCER

This invention relates to medical diagnostic ultrasound systems and, in particular, to two-dimensional array transducers which are curved in the azimuthal dimension.

One-dimensional curved linear array transducers have been in commercial use for a number of years in ultrasound imaging. Curved arrays are particularly useful for their wide field of view and find use in abdominal applications such as obstetrical imaging. Small, tightly curved arrays are frequently used for indwelling probes such as endorectal and endovaginal probes. The curvature of the transducer array disperses the beams in a divergent fan-like pattern and reduces the range of electronic delays needed for beam steering and focusing. Curved arrays are conventionally manufactured by dicing a piezoelectric transducer material partially into a flexible substrate, forming a flat but flexible linear array. The flexible linear array is then bent over a block of backing material which has been machined to the desired curvature and provides acoustic damping as well as holding the shape of the newly curved array. Electrical connections are then made to the exposed ends of the transducer elements, generally by means of flex circuit.

While this process works well for one-dimensional curved arrays, greater challenges are faced when trying to produce a curved two-dimensional (2D) array. Because elements in the interior of the 2D array cannot be reached by side attachment of signal conductors, interior element connections must be made from the back of the array. Connecting to these interior array elements is complicated by the fact that the back of the array is curved. Furthermore, the number of signal and control conductors of any two-dimensional (2D) array can become substantial. An approach to reducing the number of conductors presented to the system is to incorporate an application specific integrated circuit (ASIC) in the transducer which preforms, combines and processes signals from groups of elements, reducing the number of output conductors needed to a manageable amount. Still, the interconnection of the large number of array elements to the ASIC can be problematic.

In a flat array, the interconnect problem may be simplified by bonding the ASIC directly into the transducer array stack. The stack is diced without penetrating the ASIC and separate array elements are created, having direct electrical contact to the ASIC. But for a curved array, the presence of a rigid ASIC in the transducer array stack makes curving the array difficult. Thus it is desirable to provide an approach to fabrication of a curved 2D array transducer which overcomes these difficulties.

In accordance with the principles of the present invention, a curved two-dimensional array transducer is provided which allows a flat array transducer with an ASIC or other integrated circuitry to be curved in the desired shape. This is accomplished by first bonding both an ASIC and a flexible substrate into the array stack, with the ASIC interposed between the piezoelectric material and the flexible substrate. The array stack is then diced into the flexible substrate with cuts that penetrate the ASIC and divide it into segments along the azimuthal axis.

In one example a novel ASIC is used that has an absence of circuitry in regions to be removed by dicing. Each ASIC segment is fully functioning and independently controls the elevational elements at each azimuthal position. The array stack may now be bent over a curved backing block, and the individual ASIC segments are wired together to restore control of all the ASIC segments. The cuts defining elements in the elevational direction do not penetrate the ASIC, as there is no curving in this direction.

In another example of the present invention, the flexible substrate is a flex circuit which is interposed between the piezoelectric material and the ASIC. In this case, the piezoelectric material is diced into the flex circuit from the top, and the ASIC is diced into the flex circuit from the bottom in a separate step. The flex circuit provides connection between the ASIC and the array elements, as well as playing its role as a flexible substrate. Additionally, the flex circuit may be designed to provide a transition from the array pitch to the ASIC pitch, either in azimuth or in elevation.

Figure 1:
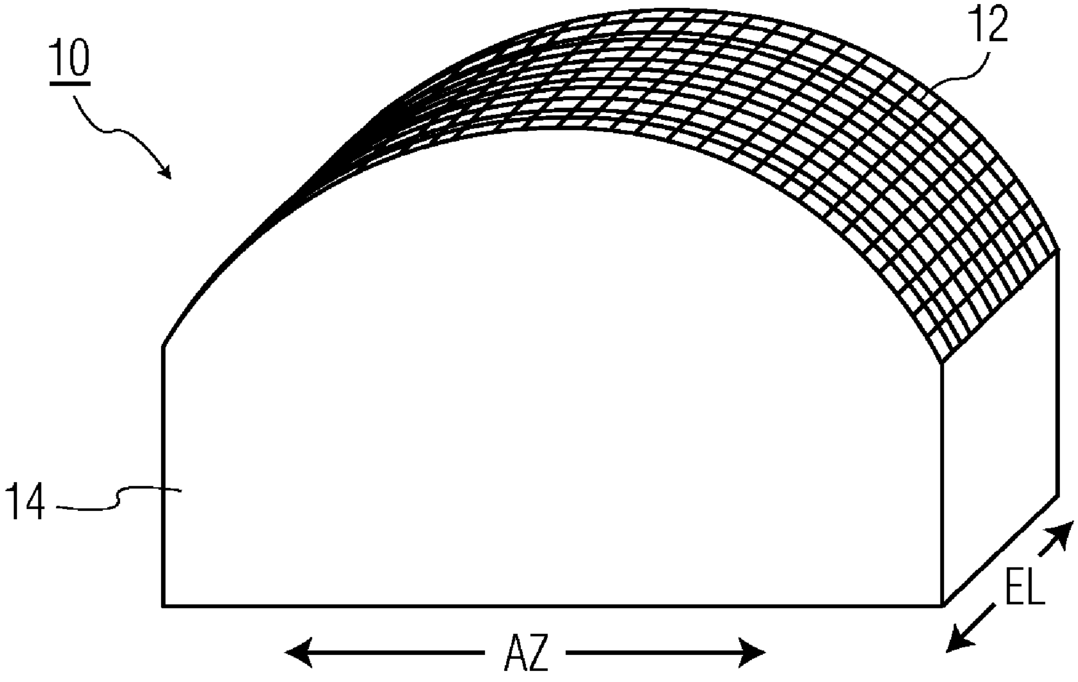
FIG. 1 is a perspective view of a curved two-dimensional transducer array stack of the present invention.
Figure 2:
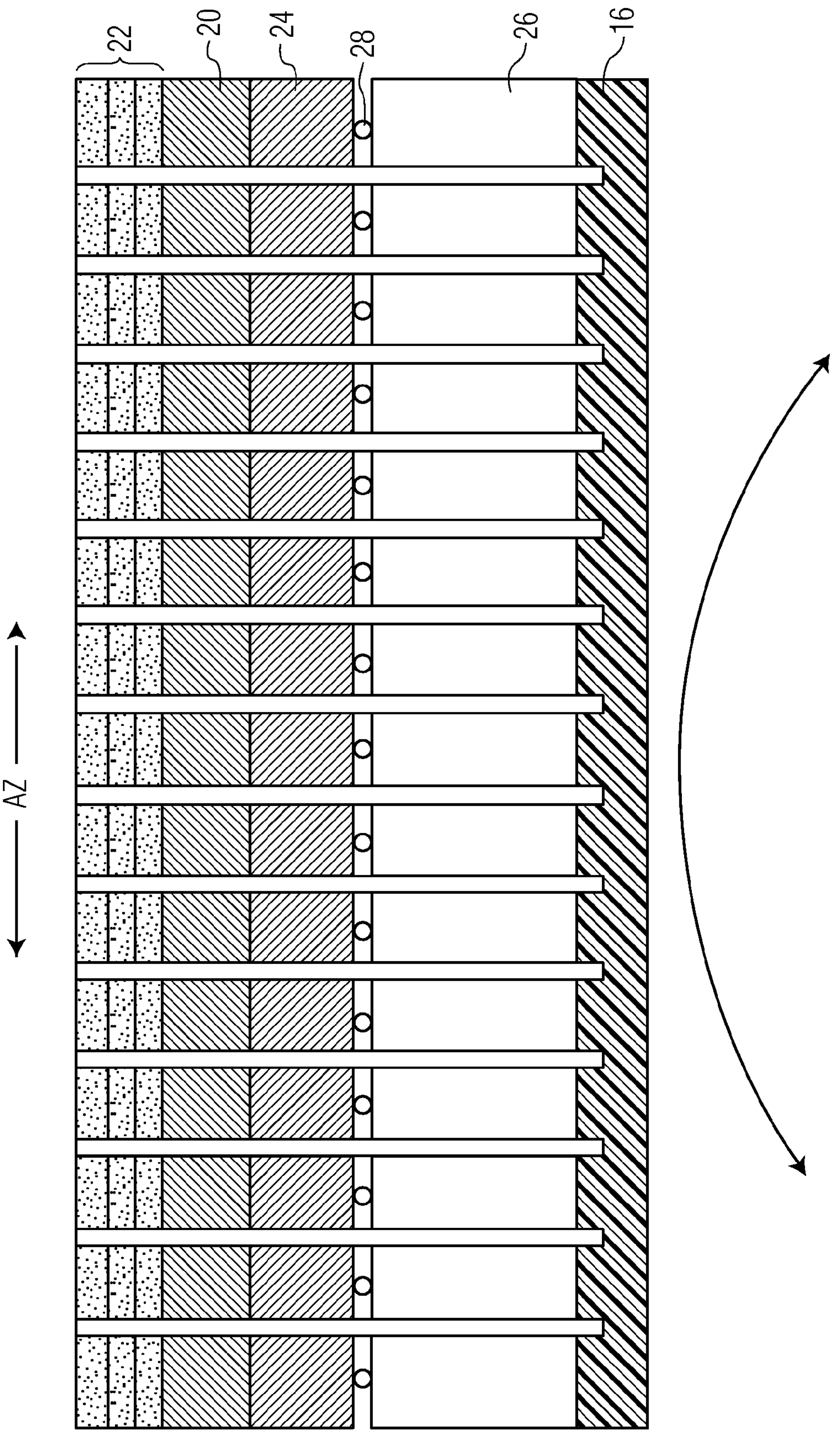
FIG. 2 is an azimuth view of the layers of a transducer array stack of the present invention in cross-section.

Referring first to FIG. 1, a 2D curved transducer array 10 is shown. The transducer array is comprised of a matrix of transducer elements 12 formed on a curved surface and located on a curved backing block 14. In this example the transducer array is curved in the azimuth (AZ) dimension and each row of elements is linear in the elevation (EL) dimension. The backing block 14 provides the rigid curved surface necessary to hold the transducer elements 12 in their proper positions. The backing block also provides a means to attenuate unwanted acoustic energy emitted from the back of the array. The transducer array is formed from a stack of transducer material layers overlaid on an ASIC and a layer of backing material 16 as shown in FIG. 2. The layer of backing material 16 is referred to as a backing wing. Individual transducer elements are defined by dicing through the stack materials and ASIC and into the backing wing 16. The backing wing serves to hold the transducer array together and is flexible so that it can be formed over the backing block 14. A dematching layer of a conductive material with a high acoustic impedance retards the coupling of acoustic energy from the piezoelectric layer 20 into the ASICs 26. The conductive material conducts signals between the piezoelectric elements 20 and the circuitry of the ASIC below the dematching layer 24. The dematching layer 24 is bonded to the ASIC by conductive bumps 28 which also provide a space between these two layers. Above the piezoelectric layer 20 in this example are three impedance matching layers to match the impedance of the piezoelectric to tissue. In accordance with the principles of the present invention this acoustic stack of layers is diced with cuts running in the elevation dimension which extend through all of the layers and into the backing wing 16 as shown by the white dicing cuts in FIG. 2. In order to facilitate these cuts, the circuit elements of the ASIC are arranged to be beneath the resultant piezoelectric elements and do not run between the elements in the azimuth direction where the cuts in the elevation direction are made. Thus, these dicing cuts can extend completely through the ASIC into the backing wing without severing any of the ASIC circuitry. Once diced, the array can be bent in an arc as indicated by the arrow below the array stack.

Figure 2A:
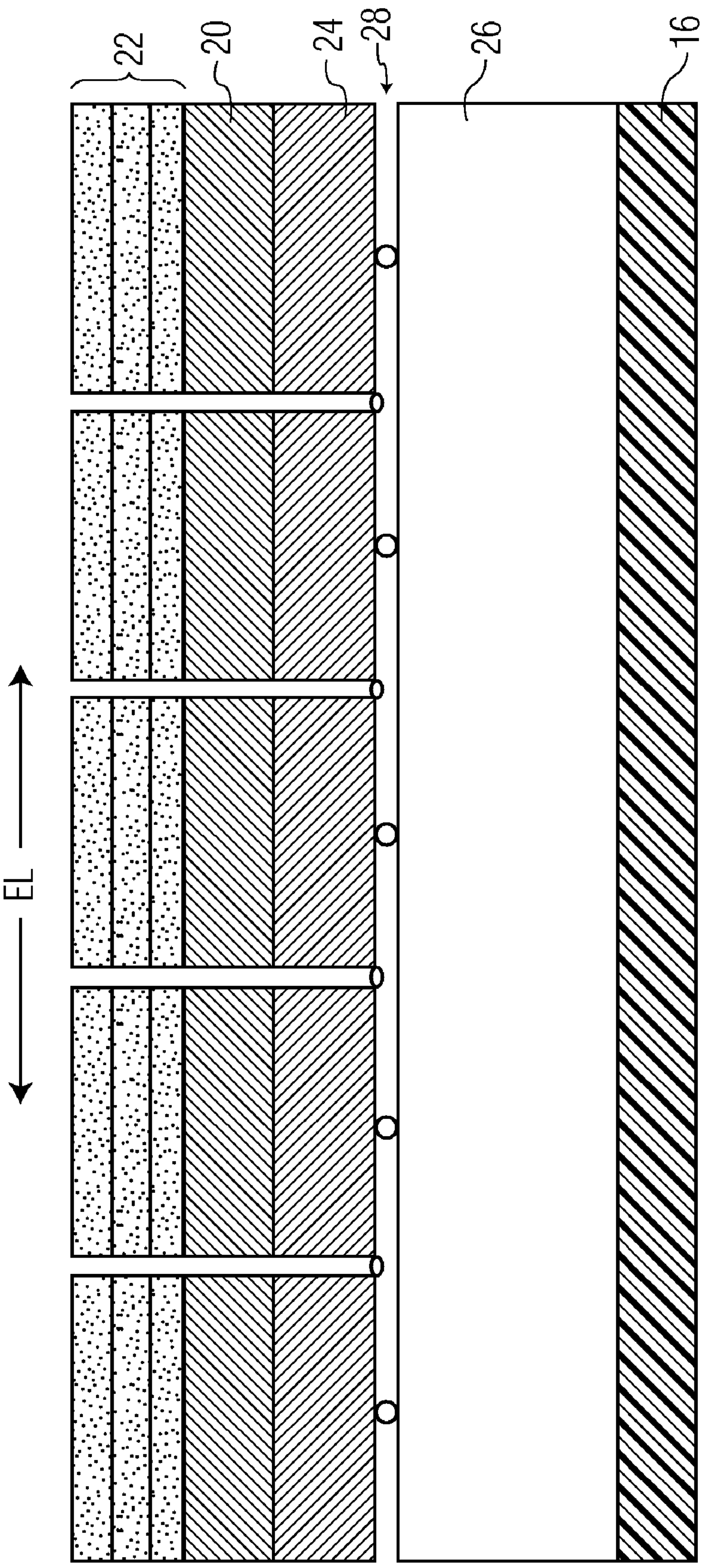
FIG. 2A is an elevation view of the layers of the transducer array stack of FIG. 2.

FIG. 2A shows the transducer stack of FIG. 2 from the elevation direction. The dicing cuts in this direction are seen to extend through the matching layers 22, the piezoelectric layer 20 and the dematching layer 24 and are seen to terminate in the space above the ASIC layer 26 which is created by the conductive bumps 28. When the transducer stack is curved only in the azimuth direction as shown in FIGS. 1 and 2 it is not necessary to dice the ASIC in this direction as each elevational row of transducer elements remains linear in this example.

Figure 3:
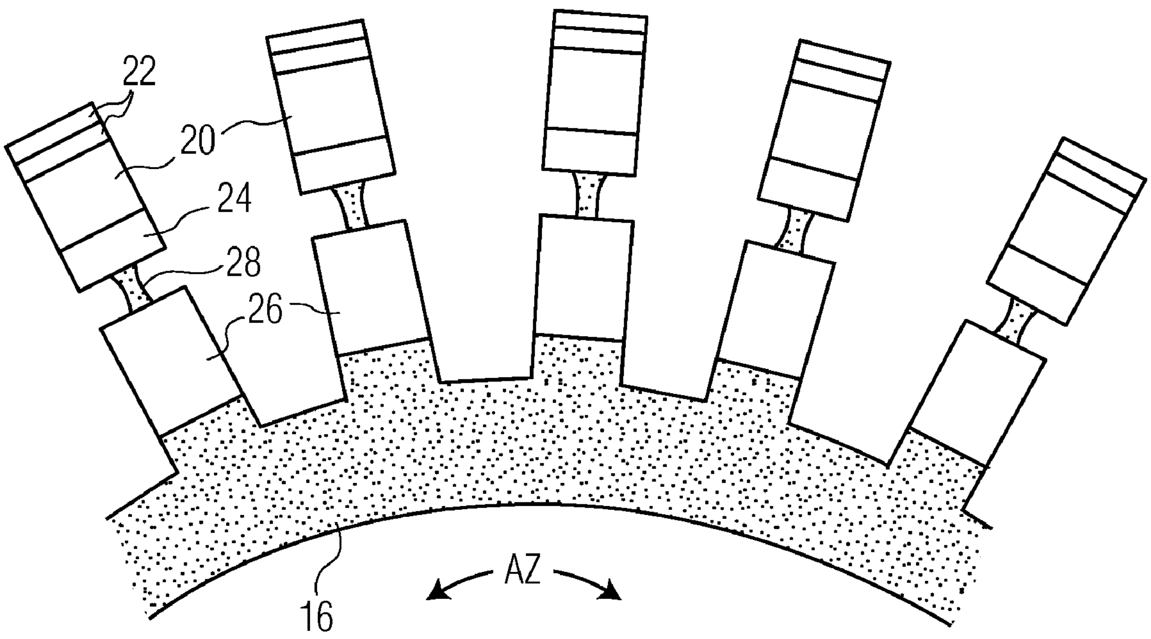
FIG. 3 illustrates the curving of elements on a flexible backing wing of a 2D array of the present invention.

FIG. 3 illustrates the arcuate configuration of the 2D array after the backing wing 16 has been bent over a curved surface to give it the desired curvature. In this illustration the curvature has been exaggerated to better illustrate it. This drawing shows the conductive bumps 28 which are located between the dematching layer 24 and the ASIC layer 26 when the layers are assembled before dicing. The conductive bumps space layers 24 and 26 apart to provide a tolerance for dicing the elements in the azimuth direction. The cuts are made by extending the dicing saw blade into the space created between layers 24 and 26 by the conductive bumps. This enables dicing of the layers above the ASIC in the azimuth direction without the need to cut into the ASIC, thereby enabling circuitry and conductors to be run through the ASIC in the elevation direction. Thus, in this example, the dicing cuts in the azimuth direction extend only to the space above the ASIC 26 and the dicing cuts in the elevation direction extend completely through the ASIC into the backing wing 16 to enable the array to be curved in the azimuth direction as illustrated in FIG. 3.

Figure 4:
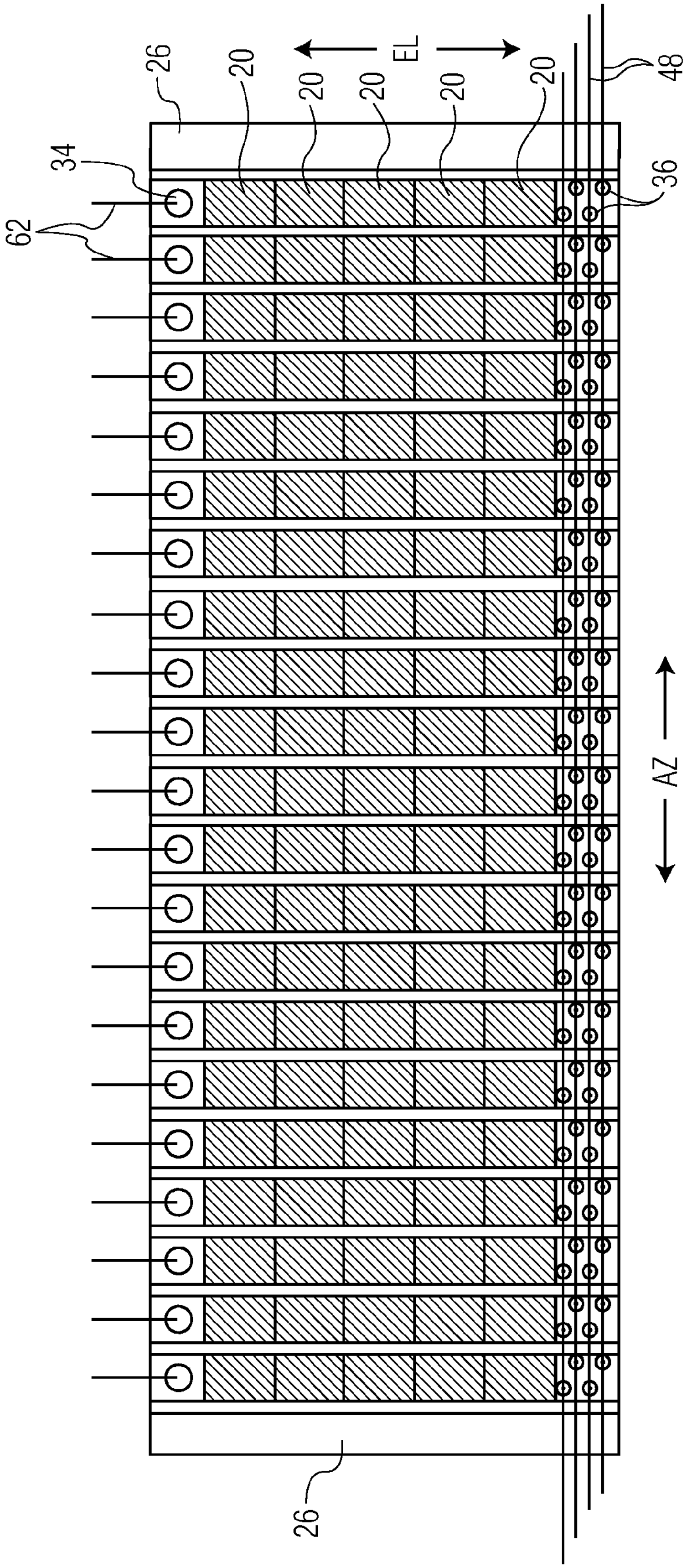
FIG. 4 is a top plan view of a 2D array constructed in accordance with the principles of the present invention.

FIG. 4 illustrates the top surface of an array stack of twenty-one elements in the azimuth direction and five elements in the elevation dimension. The five piezoelectric elements 20 have been numbered in one of the rows. At the top of the drawing in this view and running along one side of the array are connection pads 34 by which wire or flex circuit conductors 62 can be attached to each row to conduct signals transmitted and/or received by the elements of the row. The connection pads 34 are located on the upper surface of the ASIC layer 26 in this example, which extends out from the side of the rest of the piezoelectric stack. The ASIC layer also extends out from the piezoelectric stack on the other side of the array where connection pads 36 are located for the application of control signals to the ASIC circuitry. In this example the conductors 36 are bussed together by wire or flex circuit conductors 48.

Figure 5:
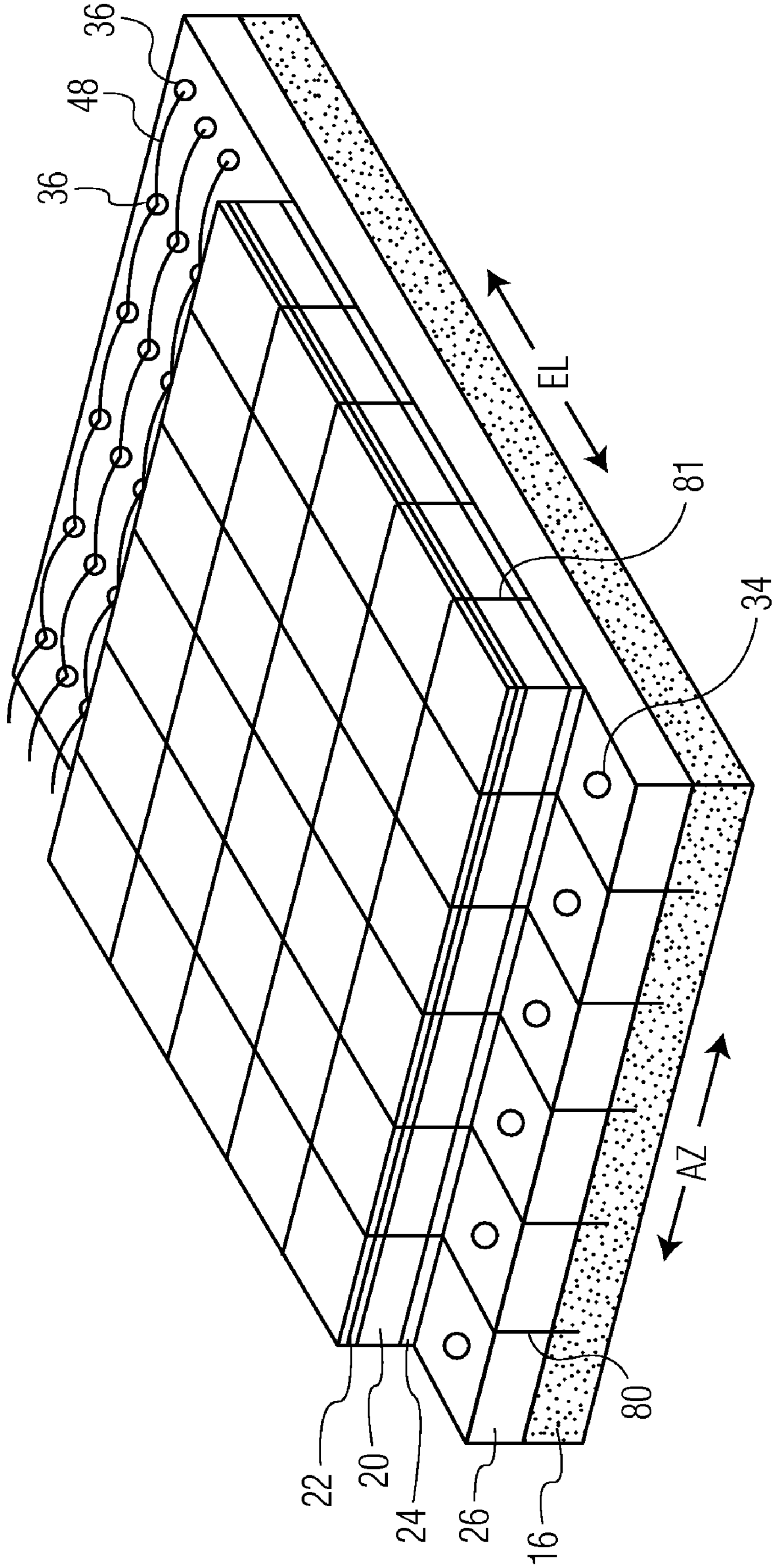
FIG. 5 is a perspective view of an example of the present invention in which a backing wing forms the flexible substrate.

FIG. 5 is a perspective view of another example of a two-dimensional array of the present invention prior to bending the stack. The stack is assembled on the backing wing 16 with the ASIC layer 26 located directly on the backing wing. The connection pads 34 are seen on the near top surface of the ASIC 26 and the control line connection pads 36 are on top of the ASIC at the back of the illustration. In this example the control connection pads 36 are “stitched” together by wires 48 going from one pad to the next. Conductive bumps are located between the top of the ASIC 26 and the dematching layer 24, and are not visible in this illustration. The stack has been diced through to the backing wing 16 by dicing cuts 80 extending in the elevation direction. It has also been diced through to the space above the ASIC 26 created by the conductive bumps by the dicing cuts 81 extending in the azimuth direction. The stack is thus ready to be curved into its final desired shape.

Figure 6:
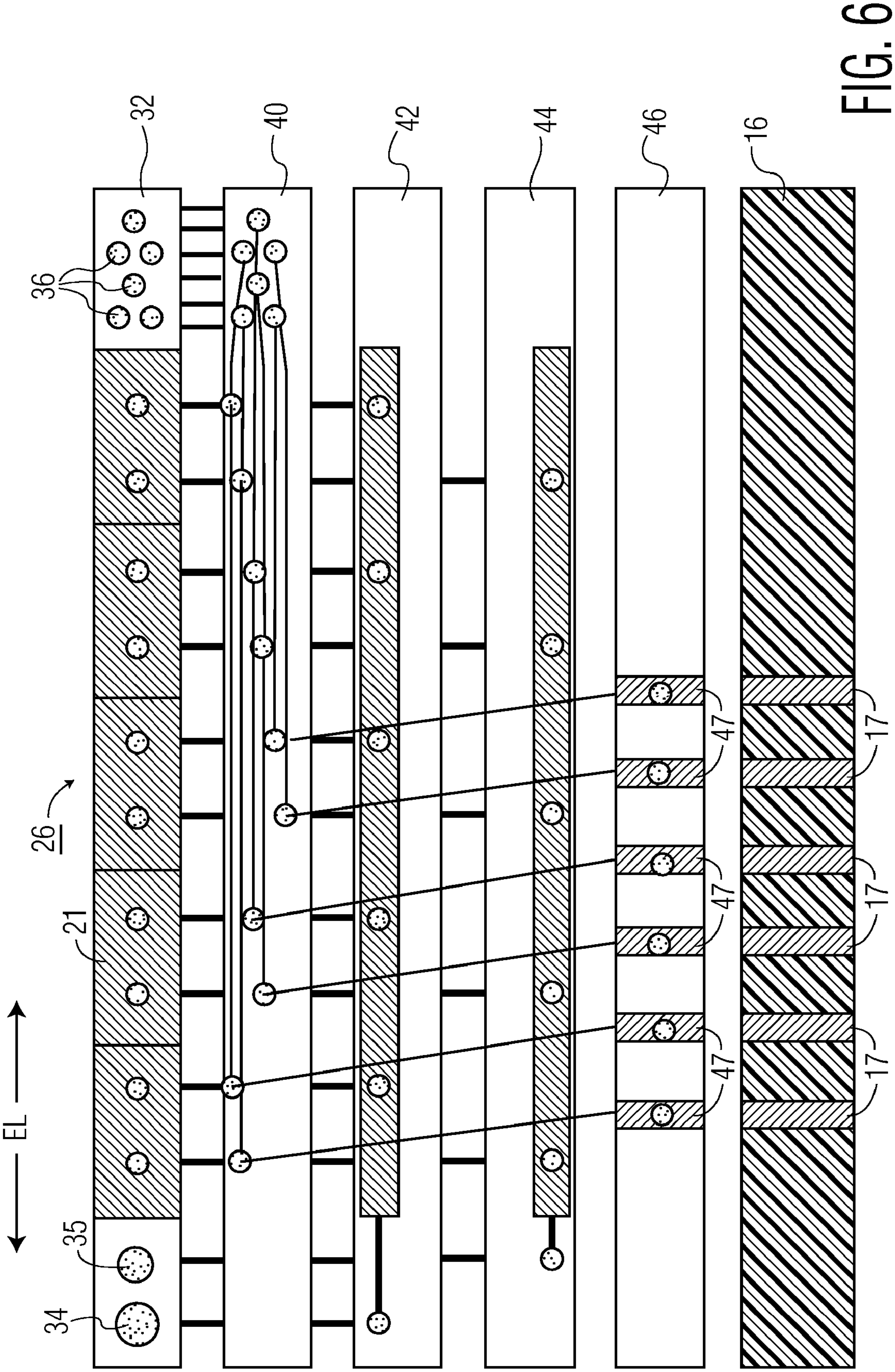
FIG. 6 illustrates the different layers of an ASIC which may be used to connect to the elements of a 2D transducer array of the present invention.

FIG. 6 is a conceptual illustration of layers 40-44 which make up an ASIC 26 and the top and bottom surfaces 32 and 46 of the ASIC. The drawing depicts the ASIC segment for only one of the twenty-one azimuthal rows of elements in FIG. 4. The five views of this ASIC segment are broken out and all shown in top view for visibility. The upper layer 32 shows the top of the ASIC segment. At one end of the ASIC segment is the connection pad 34 which is connected by a vertical via to the receive layer 42. Adjacent to the connection pad 34 is a connection pad 35 which is connected by a vertical via to the transmit layer 44. The connection pad 35 is used to apply drive signals to the ASIC and transducer elements. It is acceptable to combine the transmit and receive connection pads and respective layers if only a single transmit/receive line exists for each azimuthal row as shown in the example of FIG. 4. In that example, connection pad 34 serves to connect both transmit and receive lines to the attached flex circuit. Five areas of conductive plating 21 are located on top of the ASIC which contact the overlaying dematching layer 24 and conduct signals to and from each of the piezoelectric elements above the ASIC. Each area 21 is connected by one via to the transmit layer 44 for the application of drive signals to the piezoelectric elements, and connected by a second via to the receive layer 42 where signals from the elements are received. On the right side of the top layer are six connection pads 36 where control signals are applied for the five piezoelectric elements above the ASIC row. Several of the control signals in this example are dedicated to controlling a pair of elements. One control signal controls switches in the transmit signal paths of the outer (far left and far right) elements and another control signal controls switches in the receive signal paths for these outer elements. Another pair of control signals control the transmit and receive signal paths of the second and fourth elements and another pair of control signals control the transmit and receive signal paths of the center element in the row. This constrains these elements to operate in symmetric pairs when steering in the elevational direction is not needed. This arrangement is typical of a 1.5D array. By adding more control lines for asymmetrical operation the array can be operated in a 2D mode in which beams can be steered and focused from side to side in the elevation direction.

The next layer of the ASIC of FIG. 6 is the switch layer 40 where switches and delay elements controlled by the control signals from connection pads 36 are located. In the receive layer 42 signals received from the transducer elements which have been switched and delayed in the switch layer 40 are bussed to the via connected to the connection pad 34. In the transmit layer 44 transmit signals from the connection pad 35 are distributed to vias for each of the transducer elements. These vias are switched and may be delayed as desired by circuitry in the switch layer 40. The layer 46 illustrates the bottom of the ASIC 26. This drawing shows a second method for bringing control signals to the ASIC which is by six conductors 47 on the bottom of the ASIC. The signals from these conductors are applied to the electronics in the switch layer 40 by vias extending upward through the ASIC from the conductors 47. Connection to the conductors 47 can be by conductors 17 located on or brought through the backing wing 16.

Figure 7:
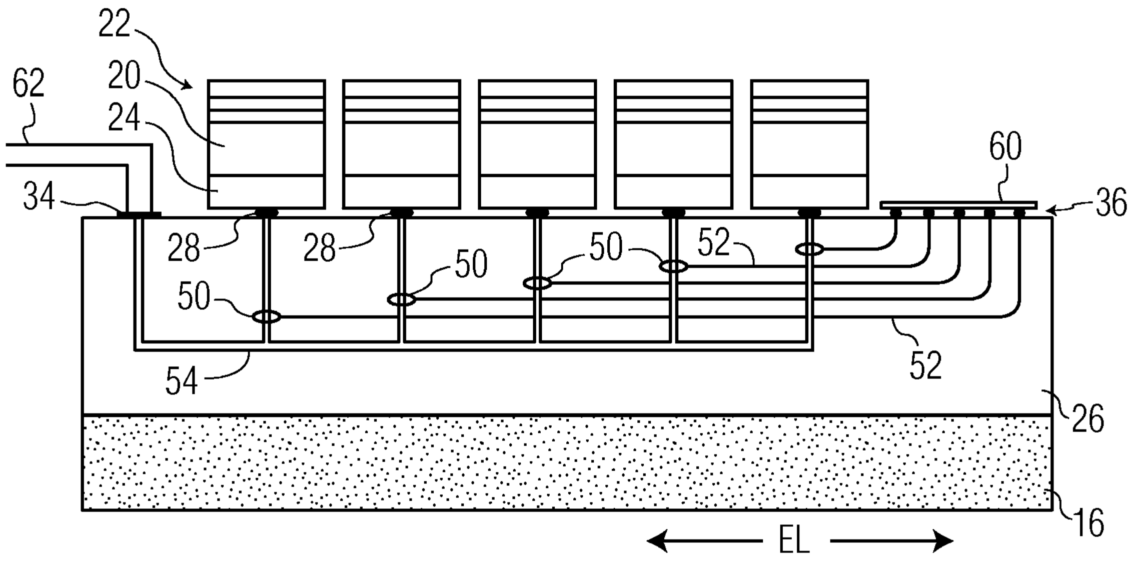
FIG. 7 is a cross-sectional elevation view of the example of FIG. 5.

FIG. 7 illustrates how controlled signals can be brought to and from the transducer elements in the example of FIG. 5. A conductive line 54 in the ASIC 26 extends down from the connection pad 34 and then upward to each of the elements in the row of elements above the ASIC. As the line 54 extends up to the conductive bump 28 below each dematching layer and piezoelectric element it connects through a controlled switch and/or delay element 50. These controlled elements 50 are controlled by control signals applied by control lines 52 in the ASIC. The control lines 52 in turn are connected to the control signal connection pads 36 on top of the ASIC. In this example control signals are brought to the connection pads 36 by a strip of flex circuit 60 on top of the ASIC. A conductor 62 brings signals to and from the connection pad 34 and the elements connected to the conductive line 54.

Figure 8:
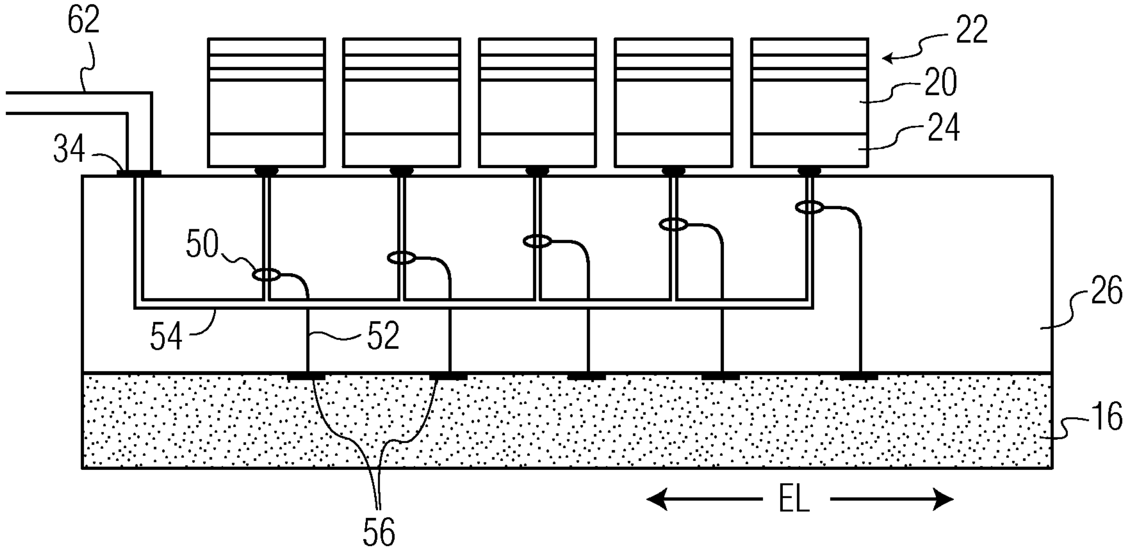
FIG. 8 illustrates a cross-sectional elevation view of an example of the present invention in which connections to an ASIC are made from the flexible substrate.

In FIG. 8 an example is given of bringing the control signals to the controlled elements 50 from the bottom of the ASIC 26. Electroded strips 56 run along the surface of the backing wing 16 and bring control signals to the control lines 52 which are accessible on the bottom of the ASIC 26. This configuration enables a narrower stack to be formed, as the area on the side of the stack for the control signal flex circuit 60 is not needed.

Figure 9:
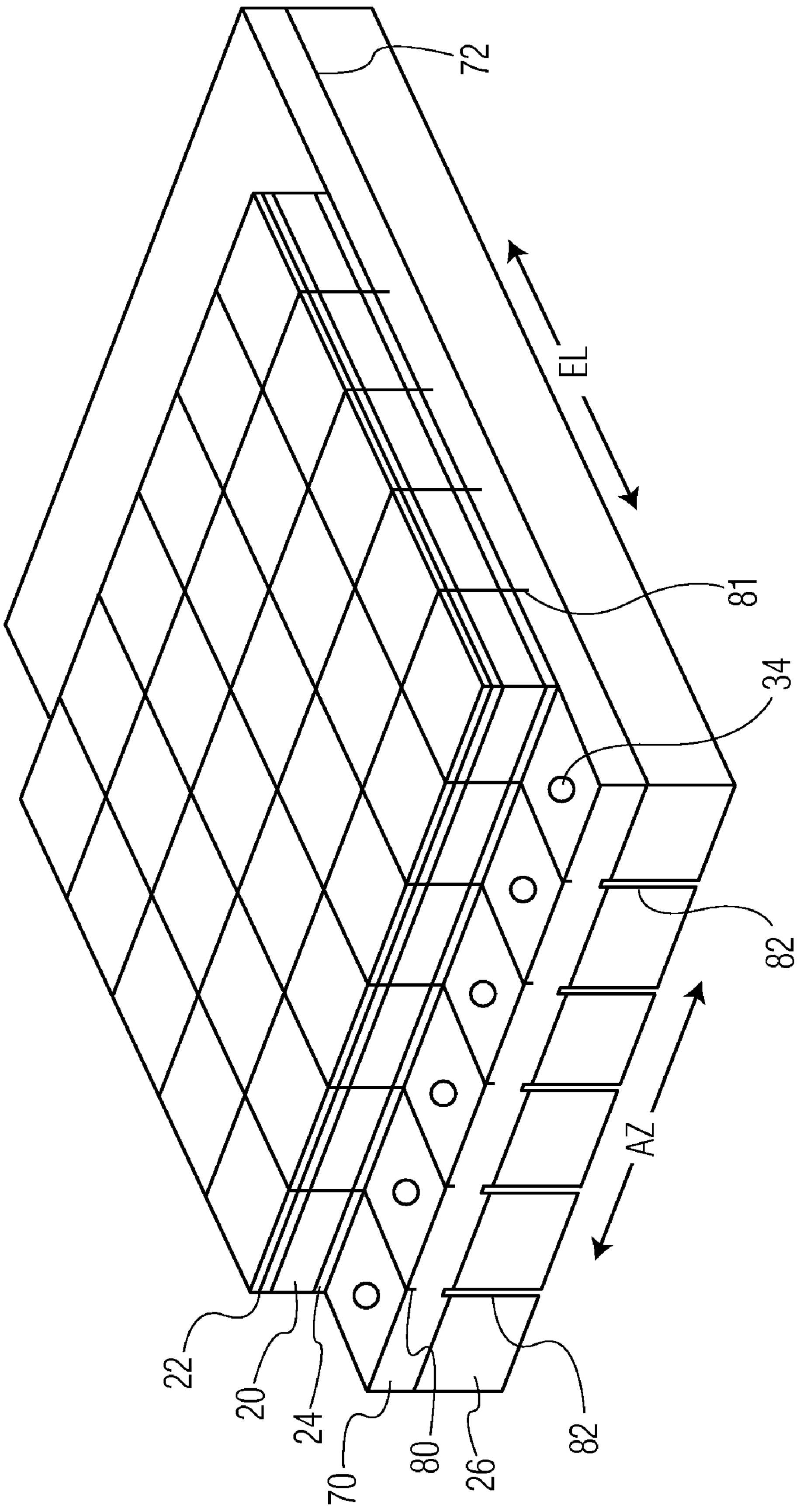
FIG. 9 is a perspective view of another example of the present invention in which a flex circuit provides the flexible substrate.

FIG. 9 is a perspective view of another example of the present invention in which the curvature of the array is promoted by a flex circuit 70. In this example the flex circuit 70 is located between the ASIC layer 26 and the dematching layer 24. The ASIC layer 26 is attached to the bottom of the flex circuit 70, and the dematching layer 24, the piezoelectric layer 20 and the matching layers 22 are assembled on top of the flex circuit. The stack above the flex circuit is diced by cuts 80 and 81 extending into the flex circuit 70 in both the azimuth and elevation directions. The ASIC 26 is diced with cuts 82 extending in the elevation direction and aligned with the dicing cuts 80. Given a sufficient width of the dicing cuts, the array can then be curved in the azimuth direction by bending the flexible flex circuit layer 70, which is the substrate holding the curved array together as it is bent. In this example no backing wing is used. The acoustic backing can be cast or attached behind the array stack after it has been curved.

Figure 10:
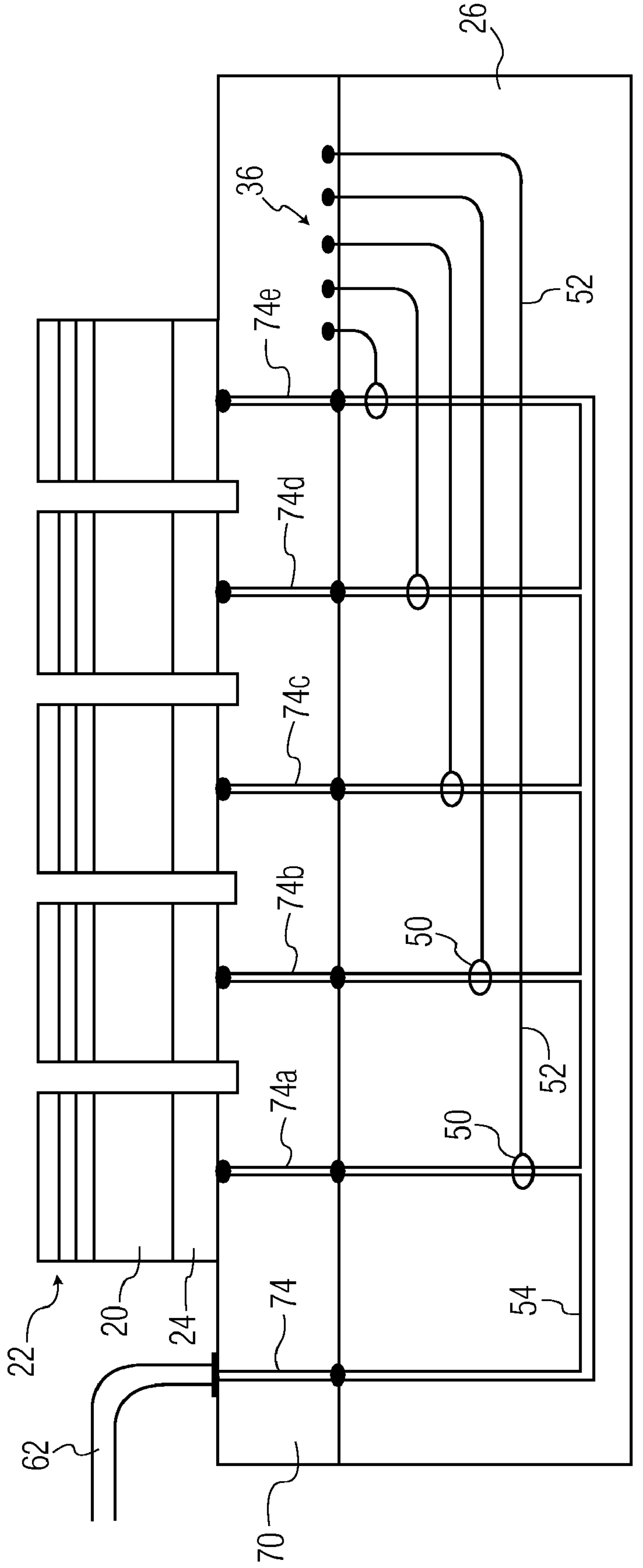
FIG. 10 is a cross-sectional elevation view of the example of FIG. 9.

FIG. 10 illustrates one technique for bringing control and signal lines to and from the elements of the example of FIG. 9. Conductor 74 extends through the flex circuit layer 70 to bring input and output signals to and from the transducer elements by means of an external conductor 62 and bus 54 in the ASIC 26. The bus 54 is distributed to each element by conductors 74*a*-74*e* in the flex circuit layer 70. The controlled switch and/or delay elements 50 for each element are controlled by control lines 52 in the ASIC which are coupled to the control signal conductors 36 on the underside of the flex circuit 70. No conductive bumps are necessary in this example because it is not necessary to create a dicing tolerance space between the ASIC and the dematching layer. Instead, the dematching layer is attached directly to the top surface of the flex circuit and the dicing cuts are made a short distance into the flex circuit as the drawing illustrates.

Figure 11:
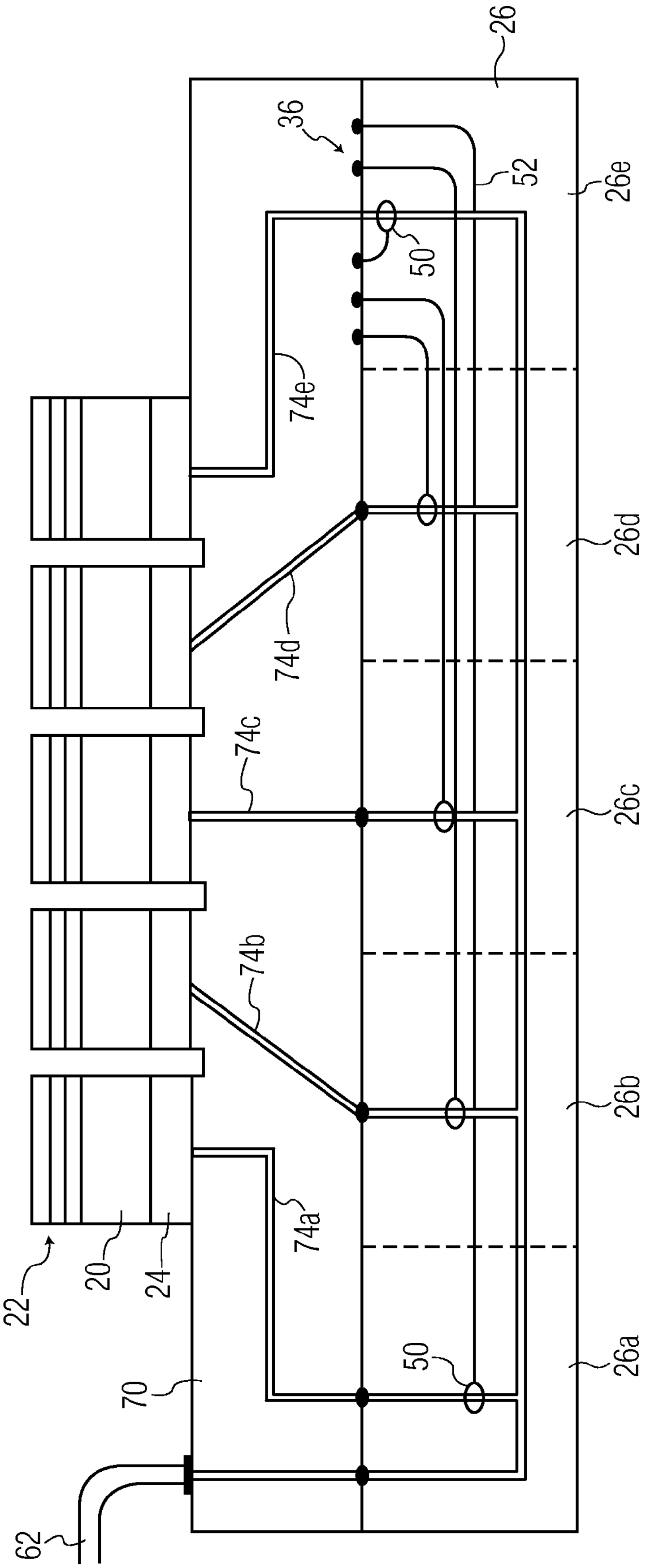
FIG. 11 is a cross-sectional elevation view of an example of the present invention in which the pitches of the transducer elements and the ASIC differ.

FIG. 11 illustrates another example of the present invention in which the flex circuit layer 70 provides a transition between different pitches of the piezoelectric stack above the flex circuit layer and the ASIC areas below the flex circuit layer. In this example the dematching layer 24, piezoelectric layer 20, and matching layers 22 are diced to the same pitch as in FIG. 10. The ASIC 26 has a larger pitch as shown by the five areas 26*a*-26*e* separated by the dashed lines. The conductors 74*a*-74*e* are seen to accommodate these different pitches by extending in this example from the centers of the transducer elements to the centers of the ASIC areas for each element by the paths they take through the flex circuit layer 70. Thus, by appropriate layout of the flex circuit layer, different pitches for the ASIC areas and the transducer elements can be accommodated in an example of the present invention.

What is claimed is:

1. A curved two-dimensional array transducer comprising:

a layer of backing material;

a layer of integrated circuitry overlaying the backing material; and a layer of piezoelectric material overlaying and electrically coupled to the layer of integrated circuitry, wherein the layer of piezoelectric material is diced in first and second orthogonal directions and the layer of integrated circuitry is diced in the second direction wherein the piezoelectric layer and the integrated circuitry layer are curved in the first direction.

2. The curved two-dimensional array transducer of claim 1, wherein the layer of piezoelectric material and the layer of integrated circuitry are diced in the second direction by a common dicing cut.

3. The curved two-dimensional array transducer of claim 2, wherein the array transducer is curved in the first direction.

4. The curved two-dimensional array transducer of claim 1, further comprising a layer of dematching material located between the layer of piezoelectric material and the layer of integrated circuitry.

5. The curved two-dimensional array transducer of claim 4, wherein the dicing cuts in the first direction extend through the layer of piezoelectric material and terminate between the layer of piezoelectric material and the layer of integrated circuitry.

6. The curved two-dimensional array transducer of claim 5, further comprising a layer of conductive segments forming electrical connections and a space between the layer of dematching material and the layer of integrated circuitry, wherein the dicing cuts in the first direction terminate in the space.

7. The curved two-dimensional array transducer of claim 1, wherein the integrated circuitry layer further comprises a plurality of signal conductors connected to a plurality of locations aligned with piezoelectric element positions of the array, wherein the plurality of locations extend in the second direction.

8. The curved two-dimensional array transducer of claim 7, wherein the integrated circuitry layer further comprises a plurality of control signal conductors extending in the second direction.

9. The curved two-dimensional array transducer of claim 8, wherein the control signal conductors are accessed from the top of the integrated circuitry layer.

10. The curved two-dimensional array transducer of claim 8, wherein the control signal conductors are accessed from the bottom of the integrated circuitry layer.

11. A curved two-dimensional array transducer comprising:

a layer of flex circuitry;

a layer of integrated circuitry underlaying and electrically coupled to the layer of flex circuitry; and a layer of piezoelectric material overlaying and electrically coupled to the layer of flex circuitry, wherein the layer of piezoelectric material is diced in first and second orthogonal directions and the layer of integrated circuitry is diced in the second direction.

12. The curved two-dimensional array transducer of claim 11, wherein the array transducer is curved in the first direction.

13. The curved two-dimensional array transducer of claim 12, wherein the flex circuitry includes a plurality of conductors electrically connecting elements of the layer of piezoelectric material with underlying circuitry of the layer of integrated circuitry.

14. The curved two-dimensional array transducer of claim 13, wherein the plurality of conductors comprise at least one of transmit or receive signal conductors.

15. The curved two-dimensional array transducer of claim 13, wherein the circuitry of the layer of integrated circuitry exhibits the same pitch as overlaying elements of the piezoelectric material.

16. The curved two-dimensional array transducer of claim 13, wherein the circuitry of the layer of integrated circuitry exhibits a different pitch as overlaying elements of the piezoelectric material in at least one direction.

17. The curved two-dimensional array transducer of claim 11, wherein the layer of integrated circuitry includes a plurality of controlled electrical elements associated with ones of the elements of the piezoelectric layer, wherein the flex circuitry layer includes a plurality of control signal conductors electrically coupled to the controlled electrical elements of the layer of integrated circuitry.

* * * * *